(12) United States Patent
Yuan et al.

(10) Patent No.: US 6,396,149 B1
(45) Date of Patent: May 28, 2002

(54) METHOD FOR DOUBLE-LAYER IMPLEMENTATION OF METAL OPTIONS IN AN INTEGRATED CHIP FOR EFFICIENT SILICON DEBUG

(75) Inventors: Xuejun Yuan, San Jose; Xiaowei Jin, Mountain View; Rambabu Pyapali, Santa Clara; Raymond A. Heald, Los Altos; James M. Kaku, Palo Alto; Helen Dunn; Thelma C. Taylor, both of San Jose; Peter F. Lai, Mountain View; Aharon Ostrer, Sunnyvale, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/593,284

(22) Filed: Jun. 13, 2000

(51) Int. Cl.[7] .......................... H01L 27/10; H01L 23/48; H01L 23/52; H01L 29/40
(52) U.S. Cl. ........................................ 257/758; 257/202
(58) Field of Search .................... 257/758, 773–776, 257/202–211; 438/622–624, 118

(56) References Cited

U.S. PATENT DOCUMENTS

| | | | | |
|---|---|---|---|---|
| 4,685,033 A | * | 8/1987 | Inoue ........................ | 361/794 |
| 5,095,352 A | * | 3/1992 | Noda et al. ................ | 257/202 |
| 5,288,949 A | * | 2/1994 | Crafts ........................ | 174/250 |
| 5,648,826 A | * | 7/1997 | Song et al. ................. | 349/49 |
| 5,928,769 A | * | 7/1999 | Monma et al. ............. | 428/210 |

* cited by examiner

Primary Examiner—Tom Thomas
Assistant Examiner—Cuong Q Nguyen
(74) Attorney, Agent, or Firm—Thelen Reid & Priest LLP; David B. Ritchie

(57) ABSTRACT

In one aspect of the present invention, a method provides a connecting path diversion through an upper layer of an integrated circuit by alteration of a connecting path through a lower layer of the integrated circuit. This method enables a circuit path in an integrated circuit to be modified in an accessible layer for testing before the modified circuit path is incorporated in a redesigned integrated circuit design.

In another aspect of the present invention, a modified multi-layer integrated circuit chip includes a connecting path formed in a lower layer and a substitute connecting path that is etched in the lower layer. Subsequently, the connecting path formed in the lower layer may be severed.

9 Claims, 2 Drawing Sheets

METHOD FOR DOUBLE-LAYER IMPLEMENTATION OF METAL OPTIONS IN AN INTEGRATED CHIP FOR EFFICIENT SILICON DEBUG

BACKGROUND OF THE INVENTION

1. Field of the Invention

The present invention is generally directed to creating an alternative conductive path or metal option for a flip-chip. More specifically, the present invention is directed to altering an easily accessible low metal layer to affect a change in a high metal layer.

2. Background

Testing of the circuitry of an integrated circuit (IC) chip may reveal flaws in the design or manufacture. The IC circuitry may be modified after manufacture by a use of a focused ion beam (FIB) as is well known in the art. Depending on the supplemental gas injection, if any, a FIB may etch away a material layer and may or may not deposit new material for creating a connection between points in the circuitry.

An IC may include several conducting layers having separate circuit configurations based on respective functions. While a FIB may be used to etch through multiple layers, the aspect ratio of width to depth (typically between about three and ten) limits the practical applicability to the first few lower layers. Some IC designs employ several layers, and a high metal layer may be difficult to modify by a FIB due to the lower intervening layers.

Typically, metal options for modifying IC circuitry are implemented at higher layer metals after option changes are implemented, due to reduced process time and cost. However, during the testing and debug stage of IC design modification, the associated retooling requirements are not cost effective.

Accordingly, there exists a need for an efficient, simple and inexpensive method to modify a high layer in an IC during the silicon debug stage for the primary purpose of final design verification.

SUMMARY OF THE INVENTION

In one aspect of the present invention, a method provides a connecting path diversion through an upper layer of an integrated circuit by alteration of a connecting path through a lower layer of the integrated circuit. This method enables a circuit path in an integrated circuit to be modified in an accessible layer for testing before the modified circuit path is incorporated in a redesigned integrated circuit design.

In another aspect of the present invention, a modified multi-layer integrated circuit chip includes a connecting path formed in a lower layer and a substitute connecting path that is etched in the lower layer. Subsequently, the connecting path formed in the lower layer may be severed.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons having the benefit of this disclosure.

Figure 1:
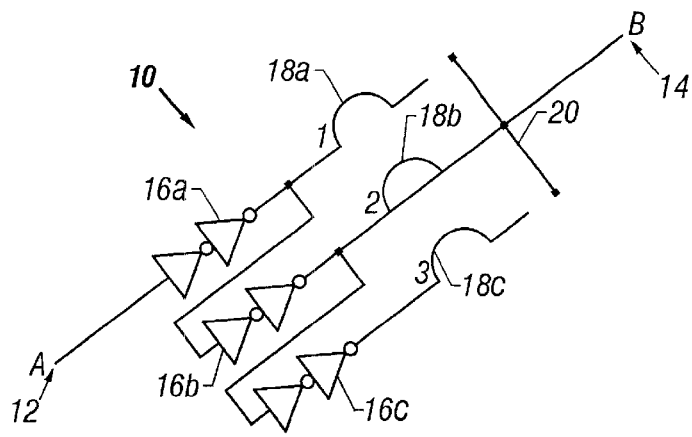
FIG. 1 is a simple circuit schematic illustrating a delay path in accordance with a specific embodiment of the present invention.
Figure 2:
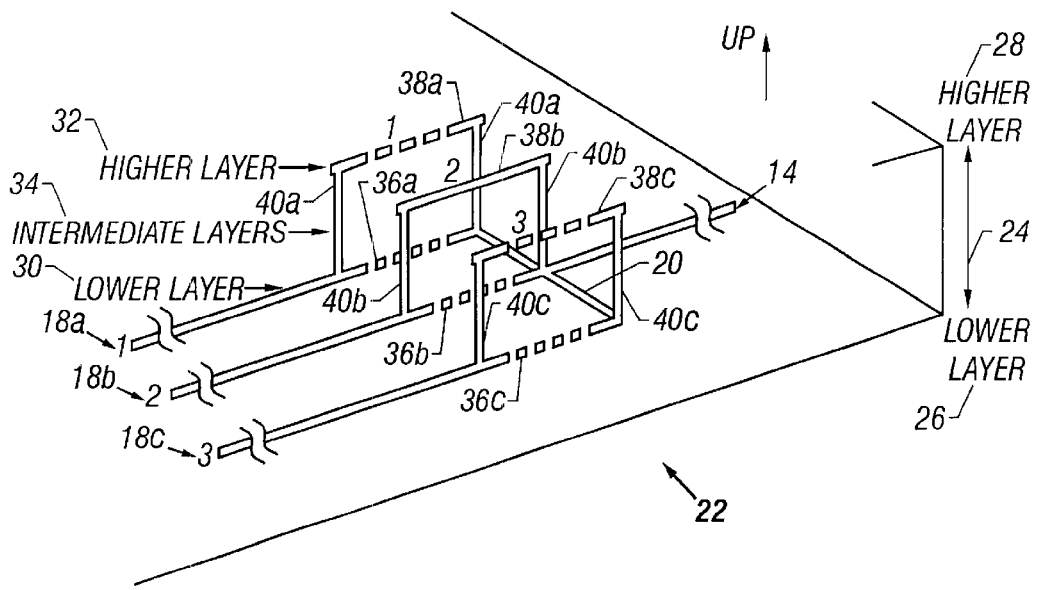
FIG. 2 is an isometric diagram illustrating the metal options in FIG. 1 in accordance with a specific embodiment of the present invention.

The present invention is directed to a procedure by which a circuit path on an upper layer of an IC may be modified by subsequent alterations to a lower layer. A simple example of an IC circuit path is shown in FIG. 1, and the corresponding implementation of its metal options (by multiple layers) is shown in FIG. 2 in isometric view. A circuit 10 may extend from "A" as input 12 to "B" as output 14. The input 12 and output 14 may serve as end connectors. The circuit may include a series of double-inversion gates 16a, 16b and 16c as a series of timing calibration options downstream of input 12. These gates may be associated with higher layer paths 18a, 18b and 18c, which may be connected to a bridge 20 to reach output 14. In the example shown, the second path of 18b is connected to bridge 20.

In FIG. 2, a multi-layer IC 22 is shown with an orientation 24 distinguishing between lower layers 26 and higher layers 28. A lower metal layer 30 may be connected to a higher metal layer 32 by means of intermediate layers or connecting lines 34. The lower metal layer 30 provides the series of paths 18a, 18b and 18c to bridge 20 for connecting to output 14. A metal may be used to create the connection in a layer due to the typically higher electrical conductivity of lower valance elements such aluminum, copper, tungsten, platinum, silver, gold or an amalgam thereof than for other materials.

From the first path 18a, the lower metal layer 30 includes an unconnected first lower path 36a with a corresponding unconnected first higher path 38a that communicate by first intermediate paths 40a. From the second path 18b, the lower metal layer 30 includes an unconnected second lower path 36b with a corresponding connected second higher path 38b that communicate by second intermediate paths 40b. From the third path 18c, the lower metal layer 30 includes an unconnected third lower path 36c with a corresponding third unconnected higher path 38c that communicate by third intermediate paths 40c. The circuit 10 shown in FIG. 1 connects input 12 to output 14 through the second path 18b via the intermediate paths 40b and connected higher path 38b.

In order to implement a modification to the circuit path 10 from the second path 18b to an alternate, such as the third path 18c, the second path 18b must be severed and the third path 18c must be connected. As a permanent design change for production purposes, this modification may be implemented in the higher metal layer 32. However, for testing and debug verification, the lower metal layer 30 may be modified as an expedient prototyping method before finalizing an IC design for production.

Figure 3:
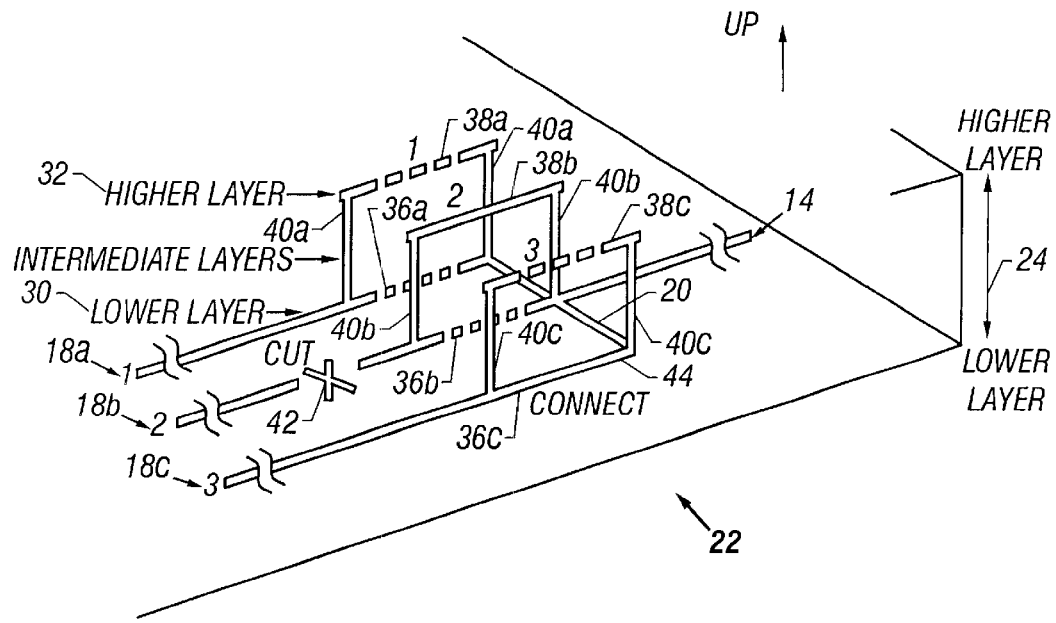
FIG. 3 is an isometric diagram illustrating the metal options after a lower layer FIB option to form an alternate path in accordance with a specific embodiment of the present invention.

On the IC 22 in FIG. 3, a disconnect cut 42 may be created in second path 18b by etching away the metal forming the connection. Thus, while higher layer path 38b in higher layer 32 remains intact, the second path 18b has been severed by the disconnect cut 42 in lower layer 30. In order to connect third path 18c, a detour connection 44 at the lower layer 30 may be created to complete the lower metal path 36c. Either or both of the disconnect cut 42 and the detour connection 44 may be performed by a FIB operation in the lower layer 30.

Figure 4:
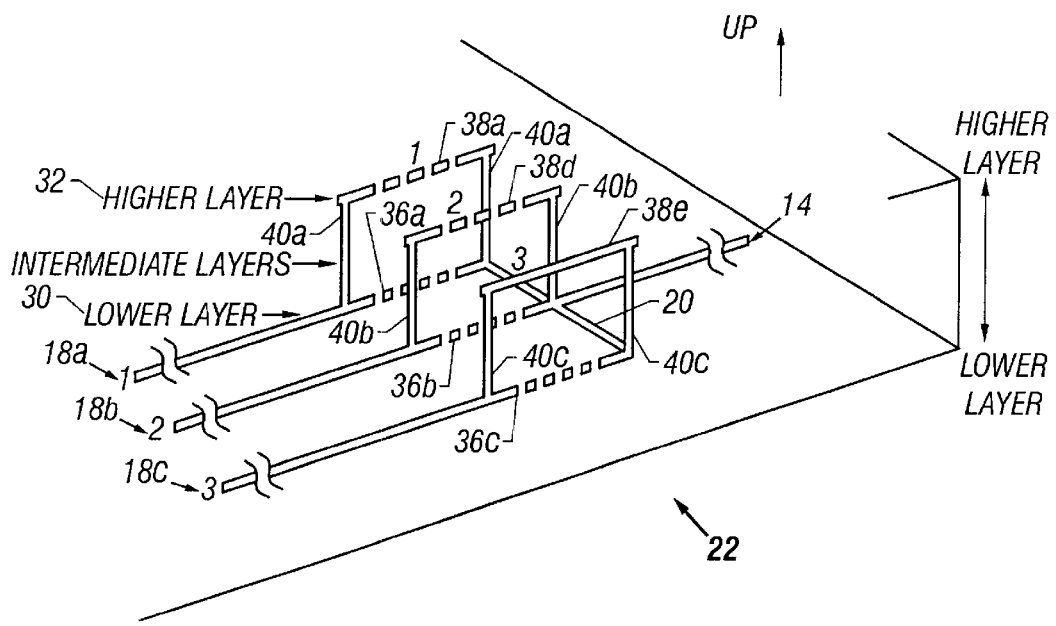
FIG. 4 is an isometric diagram illustrating the metal options in response to a design change in accordance with a specific embodiment of the present invention.

After debug and testing, a final design of the IC 22 in FIG. 4 may incorporate the third path 18c rather than the original second path 18b through the bridge 20 to the output 14. In the redesign stage, the higher layer 32 may be altered to yield an unconnected second higher path 38d severing the second path 18b, and a connected third higher path 38e connecting the third path 18c through intermediate connections 40c. The lower layer 30 in the redesign stage would maintain unconnected paths 36a, 36b and 36c as in FIG. 2. In this fashion, the circuit path changed in lower layer 30 by a FIB in FIG. 3 for debugging and testing purposes may be finalized in higher layer 32 in FIG. 4 for production after redesign.

While embodiments and applications of this invention have been shown and described, it would be apparent to those skilled in the art having the benefit of this application that many more modifications than mentioned above are possible without departing from the inventive concepts herein. The invention, therefore, is not to be restricted except in the spirit of the appended claims.

What is claimed is:

1. An integrated circuit having a high level conductor layer and a low level conductor layer, said integrated circuit comprising:
    a first connecting path in the low level conductor layer, said first connecting path having a first end and a second end, wherein the first end is coupled to a first end connector;
    a first intermediate connecting path having a first end and a second end, wherein the first end is connected to the second end of said first connecting path;
    a second connecting path in the high level conductor layer, said second connecting path having a first end and a second end, wherein the first end is connected to the second end of said first intermediate connecting path;
    a second intermediate connecting path having a first end and a second end, wherein the first end is connected to the second end of said second connecting path;
    a third connecting path in the low level conductor layer, said third connecting path having a first end and a second end, wherein the first end is connected to the second end of said second intermediate connecting path and the second end is coupled to a second end connector;
    a fourth connecting path in the low level conductor layer, said fourth connecting path having a first end and a second end, wherein the first end is coupled to said first end connector;
    a first unconnected connecting path in the low level conductor layer, said first unconnected connecting path having a first end and a second end, wherein the first end is connected to the second end of said fourth connecting path; and
    a fifth connecting path in the low level conductor layer, said fifth connecting path having a first end and a second end, wherein the first end is connected to the second end of said first unconnected connecting path and the second end is coupled to said second end connector.

2. An integrated circuit according to claim 1 further including a disconnecting cut across said first connecting path.

3. An integrated circuit according to claim 1 wherein said high level conductor layer and said low level conductor layer are composed of a metal.

4. An integrated circuit according to claim 3 wherein said metal is selected from the group consisting of aluminum, copper, tungsten, platinum, silver, gold, and an amalgam thereof.

5. An integrated circuit according to claim 1 wherein said first unconnected connecting path is connected by a focused ion beam.

6. An integrated circuit according to claim 2 wherein said disconnecting cut is etched by a focused ion beam.

7. An integrated circuit according to claim 1, further comprising a second unconnected connecting path in the low level conductor layer, said second unconnected connecting path having a first end and a second end, wherein the first end is connected to the second end of said first connecting path and the second end is connected to the first end of said third connecting path.

8. An integrated circuit according to claim 1, further comprising:
    a third intermediate connecting path having a first end and a second end, wherein the first end is connected to the second end of said fourth connecting path;
    a second unconnected connecting path in the high level conductor layer, said second unconnected connecting path having a first end and a second end, wherein the first end is connected to the second end of said third intermediate connecting path; and
    a fourth intermediate connecting path having a first end and a second end, wherein the first end is connected to the second end of said second unconnected connecting path and the second end is connected to the first end of said fifth connecting path.

9. An integrated circuit according to claim 8, further comprising a third unconnected connecting path in the low level conductor layer, said third unconnected connecting path having a first end and a second end, wherein the first end is connected to the second end of said first connecting path and the second end is connected to the first end of said third connecting path.

* * * * *